United States Patent
Ernst et al.

(10) Patent No.: US 6,871,306 B2
(45) Date of Patent: Mar. 22, 2005

(54) METHOD AND DEVICE FOR READING AND FOR CHECKING THE TIME POSITION OF DATA RESPONSE SIGNALS READ OUT FROM A MEMORY MODULE TO BE TESTED

(75) Inventors: Wolfgang Ernst, München (DE); Gunnar Krause, München (DE); Justus Kuhn, München (DE); Jens Lüpke, München (DE); Jochen Müller, München (DE); Peter Pöchmüller, München (DE); Michael Schittenhelm, Poing (DE)

(73) Assignee: Infineon Technologies AG, Munich (DE)

(*) Notice: Subject to any disclaimer, the term of this patent is extended or adjusted under 35 U.S.C. 154(b) by 529 days.

(21) Appl. No.: 09/907,692

(22) Filed: Jul. 18, 2001

(65) Prior Publication Data

US 2002/0160558 A1 Oct. 31, 2002

(30) Foreign Application Priority Data

Jul. 18, 2000 (DE) ......................................... 100 34 852

(51) Int. Cl.[7] ............................................. G11C 29/00
(52) U.S. Cl. ..................................... 714/718; 365/201
(58) Field of Search ............................. 714/5, 25, 718; 713/401; 365/201, 233

(56) References Cited

U.S. PATENT DOCUMENTS

| | | | | |
|---|---|---|---|---|
| 4,849,973 A | | 7/1989 | Kubota | 714/718 |
| 6,142,683 A | * | 11/2000 | Madduri | 717/128 |
| 6,556,492 B2 | * | 4/2003 | Ernst et al. | 365/201 |
| 6,587,978 B1 | * | 7/2003 | Merritt et al. | 714/718 |
| 6,647,521 B2 | * | 11/2003 | Matsui | 714/719 |
| 6,671,836 B1 | * | 12/2003 | Lai et al. | 714/718 |
| 6,721,904 B2 | * | 4/2004 | Ernst et al. | 714/25 |
| 2003/0191995 A1 | * | 10/2003 | Abrosimov et al. | 714/719 |

* cited by examiner

Primary Examiner—Scott Baderman
Assistant Examiner—Anne L. Damiano
(74) Attorney, Agent, or Firm—Laurence A. Greenberg; Werner H. Stemer; Ralph E. Locher

(57) ABSTRACT

A method and a device for reading and for checking the time position of a data response read out from a memory module to be tested, in particular a DRAM memory operating in DDR operation. In a test receiver, the data response from the memory module to be tested is latched into a data latch with a data strobe response signal that has been delayed. A symmetrical clock signal is generated as a calibration signal. The calibration signal is used to calibrate the time position of the delayed data strobe response signal with respect to the data response. The delayed data strobe response signal is used for latching the data response. The delay time is programmed into a delay device during the calibration operation and also supplies a measure for testing precise time relationships between the data strobe response signal (DQS) and the data response.

20 Claims, 2 Drawing Sheets

METHOD AND DEVICE FOR READING AND FOR CHECKING THE TIME POSITION OF DATA RESPONSE SIGNALS READ OUT FROM A MEMORY MODULE TO BE TESTED

BACKGROUND OF THE INVENTION

Field of the Invention

The invention relates to a method and to a device for reading a data response into a test receiver from a memory module during a test of the memory module, which can be, in particular a DRAM memory in DDR (Double Data Rate) operation.

Current dynamic semiconductor memories with random access (DRAM memories), after their production, are tested with the aid of expensive production test systems. These permit signals with exactly defined voltage levels to be applied at exactly defined times to the DRAM memory (DUT=Device Under Test) undergoing testing. In order to check the read function of the DRAM memory undergoing testing, signals are read from the latter into the test system at exactly defined times and are compared with expected signal values.

Because of the high operating frequencies of current memory modules (up to 400 MHz clock frequency, for example in the case of Rambus DRAMs), the specification of the read and write signals of such memory modules requires very high accuracy, for example, in the case of DDR DRAM memories (nowadays, signal specifications of the order of magnitude of 500 ps are already common). For this reason, the production test systems suitable for the purpose have to meet the highest technical requirements, which leads to correspondingly high costs. For this reason, the testing costs of the highest frequency memory modules already amount to up to 30% of their total production costs.

Currently particularly critical is the measurement of the data strobe response signal DQS, as it is called, during the reading operation from a DRAM memory operating in DDR operation. In the case of DRAM and other memories operating in DDR operation, a data strobe response signal, as it is called, or DQS is transmitted at extremely high frequencies, and this data strobe signal DQS forms the basis upon which the DQ information is read by a controller, which in this case is the test system. This data strobe response signal or DQS signal is an alternating signal which is used by the receiver, in this case the test receiver, to read the data response, that is to say the DQ signal, with every rising and falling edge of the DQS signal.

After the aforesaid, during the test, the data strobe response signal DQS, as during true operation with a controller, should be used by the test system to read the data response signals directly as a function of the data strobe response signal. However, current production test systems do not have this function. On the other hand, in current memory test systems used in production, the data strobe response signal is considered in the same way as any data response signal or DQ signal and, in the test system, is compared with an internal time reference. As a result, direct comparison between the data strobe response signal DQS and the data response signals DQ is not possible. Instead, in current test systems, the data strobe response signal DQS is compared with an internal time reference, and then the data response signals DQ. Finally, the measured difference can be used to draw conclusions about the deviation of the data strobe response signal DQS from the data response signals DQ.

A main disadvantage of this procedure is the increased testing time, since the procedure is certainly sequential, and the measurement result has a higher inaccuracy.

SUMMARY OF THE INVENTION

It is accordingly an object of the invention to provide an apparatus and a method for reading and for checking the time position of a data response read out from a memory module undergoing testing which overcomes the above-mentioned disadvantageous of the prior art apparatus and methods of this general type. In particular, it is an object of the invention to provide such an apparatus and a method for checking the time position of a data response read out from a DRAM memory operating in DDR operation and undergoing testing in such a way that the testing time can be shortened and the measurement accuracy can be increased.

In order to achieve this object, the method according to the invention proposes to read the data response in the test receiver with a strobe signal which is generated directly internally in the test receiver from the data strobe response signal generated by the memory module undergoing test and received by the test receiver. In this case, the strobe signal is generated by the operation of a time delay on the received data strobe response signal. The time delay corresponds to desired values of the time position of the data response read from the memory module to be tested, in relation to time position of the data strobe response signal generated by the same memory module.

With the foregoing and other objects in view there is provided, in accordance with the invention, a method for reading and checking a time position of a data response read out from a memory module undergoing test, that includes steps of: generating a strobe response signal and a data response in a memory module to be tested; in a test receiver, generating a strobe signal from the strobe response signal that was generated in the memory module; and using the strobe signal to read the data response from the memory module.

In accordance with an added feature of the invention, a DRAM memory is provided as the memory module and operating the DRAM memory in a double data rate mode.

In accordance with an additional feature of the invention, in the test receiver, a delay time is determined and set in accordance with desired values of a time position between the data response read from the memory module and the data strobe response signal; and in the test receiver, the strobe signal is generated using the delay time to delay the data strobe response signal.

In accordance with another feature of the invention, the test receiver is provided with a programmable delay device and the delay time is programmed into the programmable delay device.

In accordance with a further feature of the invention, the test receiver is provided with test signal inputs for receiving the data response and the data strobe response signal; and the step of determining the delay time is performed by generating calibration signals for the data response and for the data strobe response signal and supplying the calibration signals to the test signal inputs for the data response and the data strobe response signal.

In accordance with yet an added feature of the invention, the calibration signals are generated as identical clock signals.

In accordance with yet an additional feature of the invention, the test receiver is provided with test signal inputs for receiving the data response and the data strobe response signal; and the step of determining the delay time is performed by applying externally generated calibration signals to the test signal inputs.

In accordance with yet another feature of the invention, the calibration signals are each generated as a symmetrical clock signal having a frequency that agrees with a frequency of the data response and of the data strobe response signal.

In accordance with yet an further feature of the invention, the data response is generated as a data response signal group including individual signals having a common desired time relationship with the data strobe response signal generated in the memory module.

A programmable, adjustable delay time of a delay device in the test receiver is preferably provided. In this case, in order to determine the delay time to be programmed into the delay unit in the test receiver, in each case a calibration signal for the data response and the data strobe response signal are generated, and these calibration signals are applied to the corresponding test signal inputs of the test receiver.

Alternatively, the calibration signals or the calibration signal can also be generated externally and supplied to the test receiver.

In this case, the calibration signals for the data response and the data strobe response signal are a single clock signal, whose frequency preferably coincides with the frequency of the data strobe response signal generated by the memory module to be tested.

In other copending patent applications, the inventors propose to implement test functions for memory modules to be tested, on which high time requirements are placed. These test functions take place in a semiconductor circuit in the form of the simplest possible ASIC circuit separate from a conventional semiconductor memory test system. The ASIC circuit is provided in the immediate vicinity of the semiconductor memory module to be tested because of relatively low production costs and small dimensions. In this way, the accuracy and the frequency of the test can be increased, since signal propagation times or propagation time differences between various signals can be reduced by the short lines. This solution of providing a separate BOST module (BOST=Build Outside Self Test) separate from the conventional semiconductor memory test system makes it possible, for the case described here, to comply with the boundary condition to be met for an accurate test of the time relationships between the DQ signals and the data strobe response signal DQS from the memory module to be tested. The condition is a constant and a short propagation time between the memory module to be tested and the test system, in this case the BOST module is achieved.

In accordance with yet an additional feature of the invention, a programmable calibration of the data strobe response signal DQS takes place in the BOST circuit and this assists a test which is highly accurate in terms of time and is cost-effective.

This applies in particular to DRAM memory modules which operate at high frequencies and are tested in DDR operation (Double Data Rate). As a result of the direct comparison between the data response and the time reference formed by the data strobe response signal DQS in the test receiver, that is to say in the BOST module, a mechanism for reading the DQ data is therefore provided which closely resembles an application.

With the foregoing and other objects in view there is provided, in accordance with the invention, a combination of a memory module that generates a strobe response signal and a data response while undergoing a test, and a test receiver for reading and checking a time position of the data response read out from the memory module. The test receiver includes a test signal input for receiving the data response from the memory module; at least one latch circuit for storing the data response received from the memory module, the latch circuit connected to the test signal input; and a delay device having a programmable delay time and a set input. The delay device receives the data strobe response signal from the memory module and operates, in a test cycle, to delay the data strobe response signal by the delay time to obtain a delayed strobe signal. The delay device supplies the delayed strobe signal to the set input of the latch circuit such that the data response is stored in the latch circuit.

In accordance with a further added feature of the invention, the test receiver includes: a further test signal input for receiving the data strobe response signal from the memory module, the further test signal input and the test signal input together defining test signal inputs; and a calibration device for, in a calibration cycle, calibrating the delayed strobe signal with respect to the data response from the memory module. During the calibration cycle, the test signal inputs receive a clock signal and the calibration device uses the clock signal to generate a value for calibrating the delay time of the delay device. During the calibration cycle, the calibration device generates a calibration signal. The latch circuit includes a comparator for determining a result indicating whether a successful latching has occurred. The comparator receives the calibration signal.

In accordance with a further additional feature of the invention, the calibration device includes: an input serving as a programming input of the delay device; a linear counter connected to the programming input of the delay device, the linear counter for stepwise changing the delay time of the delay device in the calibration cycle, the linear counter having a counting cycle with a plurality of counting positions; a register unit that is controlled by the counting cycle of the linear counter, the register unit, during the calibration cycle, stepwise registering the result determined by the comparator over the plurality of the counter positions of the linear counter; and an evaluation device for evaluating the result that is registered by the register unit with regard to an optimum delay time for the delay device and for setting the counter to appropriately program the delay time in the delay device for a subsequent test cycle.

In accordance with yet a further added feature of the invention, the data response generated by the memory module is defined by a data response signal group having a plurality of data response signals; and the at least one latch circuit includes a plurality of latch circuits. The plurality of the latch circuits corresponds in number to the plurality of the data response signals from the response signal group.

In accordance with yet a further additional feature of the invention, the at least one latch circuit includes two latch circuits, one of the latch circuits for storing a rising edge of the data response and another of the latch circuits for storing a falling edge of the data response.

In accordance with a concomitant feature of the invention, the test receiver is constructed in a semiconductor circuit which is separate from conventional test equipment; and the test receiver is located in an immediate vicinity of the memory module to be tested.

Other features which are considered as characteristic for the invention are set forth in the appended claims.

Although the invention is illustrated and described herein as embodied in a method and device for reading and for checking the time position of data response signals read out from a memory module to be tested, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
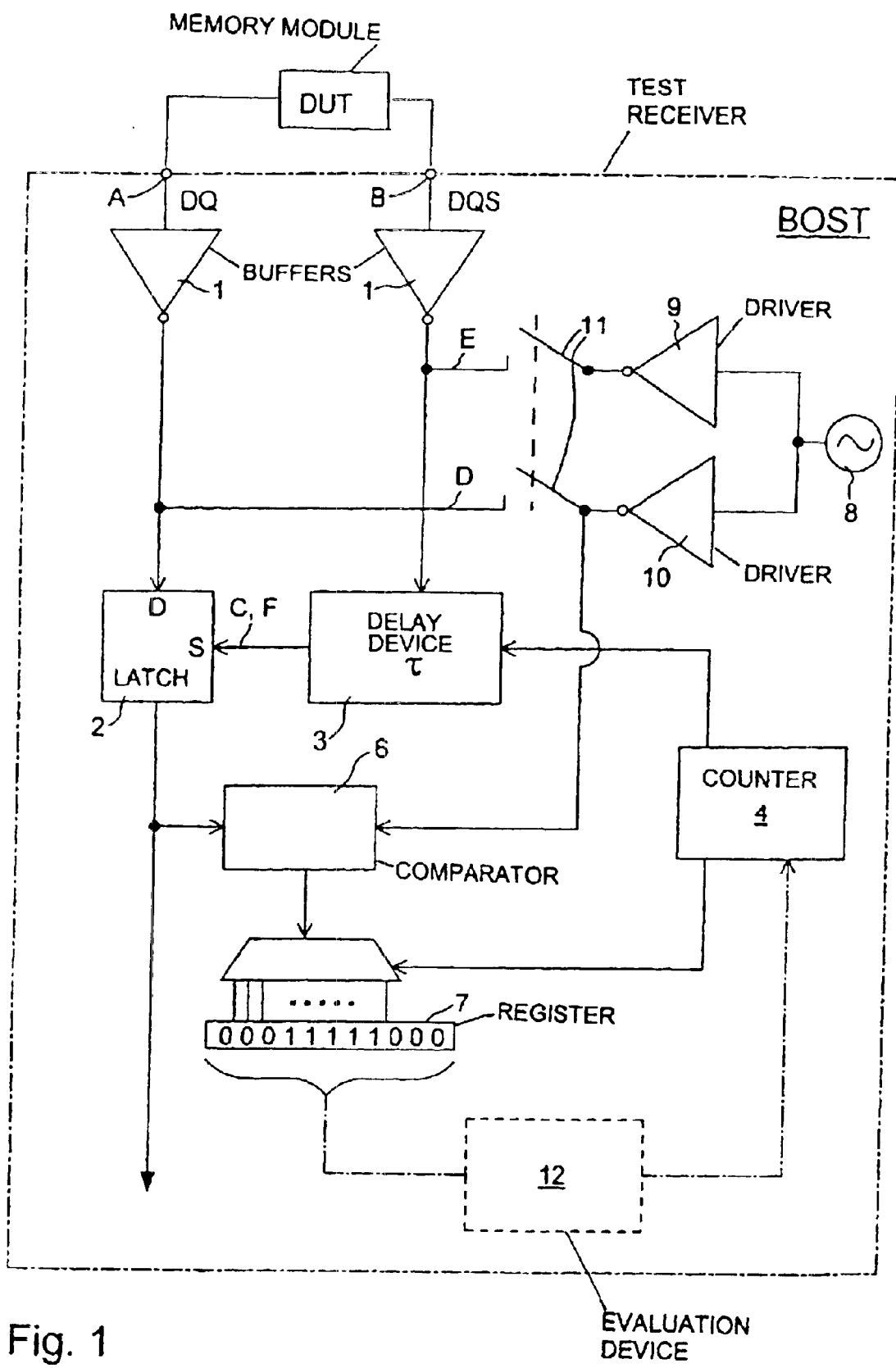
FIG. 1 shows a block diagram of an exemplary embodiment of a device having means for calibrating the DQS signal.
Figure 2:
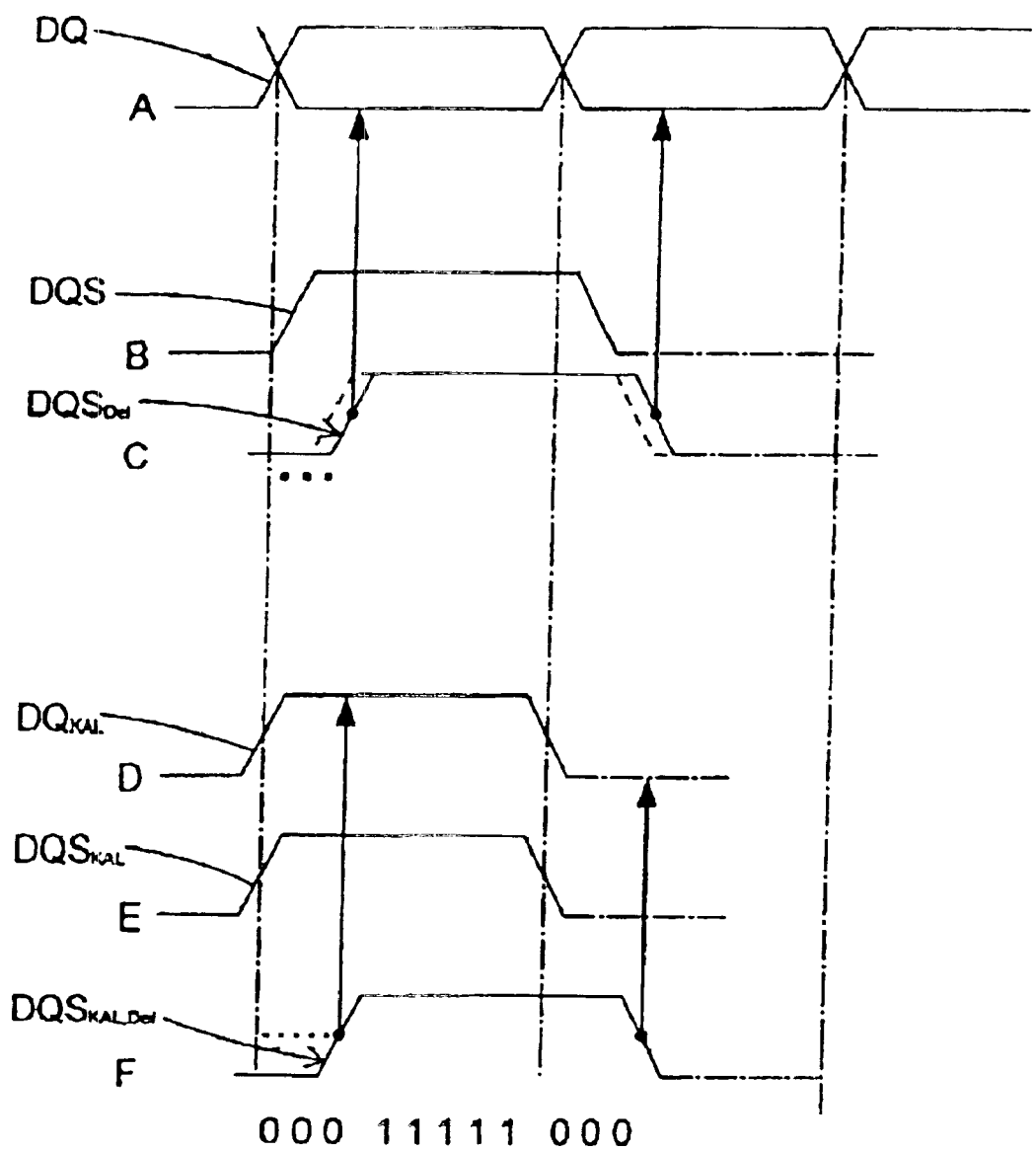
FIG. 2 shows signal timing diagrams of signals A-F on individual signal lines of the circuit illustrated in FIG. 1.

Referring now to the figures of the drawing in detail and first particularly to FIG. 1 thereof, there is shown a BOST solution of the inventive device for reading and for checking the time position of a data response read out from a memory module DUT to be tested, especially a DRAM memory in DDR operation. During the test, the data response DQ, which is received at the input terminal A, is read in, that is to say buffered, with a strobe signal $DQS_{DEL}$ (C in FIG. 2), which is generated by the operation of a time delay on the data strobe response signal DQS generated by the memory module DUT to be tested and received at the input terminal B.

It should be noted that, for simplification of the description, only a single DQ signal is illustrated on the terminal A in FIG. 1.

The data response signal DQ arriving from the DUT at terminal A passes via a buffer circuit, for example a tristate buffer 1, to a data input D of a data latch 2. The signal DQ (A in FIG. 2) present on the data input D is latched into the data latch 2 with a signal C which is present on its set input S and which is generated from the data strobe response signal DQS (signal at input B) by being delayed by a specific delay time τ in a delay device 3.

Here, it should be noted that the specification for the DRAM memory operating in double-data-rate or DDR operation envisages a very precise time relationship between the data response signal DQ and the data strobe response signal DQS. For such DRAM memories operating in DDR operation, it is for example defined that DQ and DQS may deviate from one another by a maximum of about ±500 ps, in order to ensure reliable reading by the receiver, for example a controller.

Taking this highly accurate specification into account, the test system using the method according to the invention and the device according to the invention, in which the BOST module is arranged in the immediate vicinity of the memory module to be tested, has to meet the boundary condition that the propagation time of the data response DQ and of the data strobe response signal DQS is always constant over the interfaces and the lines for one and the same BOST module or for one and the same test system.

While complying with this boundary condition, the delay time τ deliberately programmed into the delay device 3 provides a desired condition for checking the time position between the data response DQ to be read from the DUT and the data strobe response signal DQS. This is because a failure when reading the data response DQ into the latch 2, if an optimum or desired time delay τ was set in the delay device 3, is a criterion indicating that the time relationship between the data response DQ received from the DUT and the data strobe response signal DQS during the test is not correct.

The following is a description of the function of the calibration device implemented in the circuit according to FIG. 1. In order to permit the most precise possible, temperature-independent reading of the data response DQ into the latch 2, the delay time τ with which the data strobe response signal DQS is delayed in the delay device 3 is calibrated as follows. The circuit arrangement has a calibration signal generator 8 and drivers 9 and 10 and also a switch arrangement 11, with which, in a calibration cycle, a symmetrical clock signal is preferably generated and supplied. On the output side of the buffer amplifiers 9 and 10, the clock signal forms the identical calibration signals $DQ_{KAL}$ (FIG. 2: D) and $DQS_{KAL}$ (FIG. 2: E). The delay device 3 can be programmed via a counter 4. A comparator 6 compares whether or not the data latch 2 has correctly read the calibration signal $DQ_{KAL}$ (D) with the calibration signal $DQS_{KAL, DEL}$ (FIG. 2: F) that has been delayed by the delay time τ in the delay unit 3. The result from the comparator 6 is stored in a register 7. In order to calibrate the delay time τ, the counter 4 is counted up linearly, and the comparison result is stored step by step in the register 7.

The register content shown in FIG. 1 shows, by way of example, that a "0" is stored in the register 7 when the comparison result from the comparator 6 is negative, and that a "1" is stored when the comparison result from the comparator 6 is positive. In the example shown by way of explanation, the data for the counter positions 3 to 7 are read correctly. This result from the calibration operation means that in this range from counter reading 3 to 7, the data window is met sufficiently well, that is to say that the edge of the calibration signal $DQS_{KAL,DEL}$ (F) delayed by the delay time τ in the delay device 3 has correctly latched the respective logical value of the calibration signal $DQ_{KAL}$ (D) for the data response into the latch 2.

FIG. 1 shows, in dashed form, an evaluation device 12, which evaluates the calibration result in register 7 and, depending on the evaluation result, sets the counter 4 to an average value, in this example to the counter reading "5", for the true test operation following the calibration operation.

If the frequency of the calibration signal 8 is known and if the boundary condition listed above is met, the method and the device can also be used for testing the time relationships between the true data strobe response signal DQS and the data response DQ. For example, let us assume that the calibration signal in FIG. 1 is 500 MHz. 500 MHz corresponds to a cycle time of 2 ns, which means that the calibration signal has a high level for 1 ns and a low level for 1 ns. Since, in the calibration cycle in the register 7, the calibration signal $DQ_{KAL}$ for the data response was read in correctly over five counter positions, a counter position corresponds to a delay of 200 ps. It is therefore possible for the content of the register 7 to evaluate the time relationship between the data response DQ and the data strobe response signal DQS.

The circuit configuration illustrated in FIG. 1 of the device for reading and for checking the time position of a data response read from a memory module to be tested, especially a DRAM in DDR operation merely constitutes an exemplary basic design. The important feature is that, during the test, the true data response signal is delayed by a specific delay time. Numerous circuit implementations of this principle are possible, for example, in a practical implementation, the buffer amplifiers 1, the data latch 2 and the delay device 3 could be implemented in a signal circuit unit. Two data latches 2 can also be provided to latch the data response DQ in, so that in each case the rising and falling edges of the delayed data strobe response signal DQS that are present on the set input of the data latch 2 are used to latch the data response in.

We claim:

1. A method for reading and checking a time position of a data response read out from a memory module undergoing test, which comprises:
   generating in a memory module to be tested a data strobe response signal and a data response;
   receiving the data response and the data strobe response signal from the memory module to be tested in a test receiver and generating in the test receiver a strobe signal from the data strobe response signal that was generated in the memory module; and
   using the strobe signal to strobe the data response from the memory module into the test receiver.

2. The method according to claim 1, which comprises providing a DRAM memory as the memory module and operating the DRAM memory in a double data rate mode.

3. The method according to claim 1, which comprises:
   in the test receiver, determining and setting a delay time in accordance with desired values of a time position between the data response read from the memory module and the data strobe response signal; and
   in the test receiver, generating the strobe signal, delayed by the delay time, from the data strobe response signal as received by the test receiver.

4. The method according to claim 3, which comprises providing the test receiver with a programmable delay device and programming the delay time into the programmable delay device.

5. The method according to claim 4, which comprises:
   providing the test receiver with test signal inputs for receiving the data response and the data strobe response signal; and
   performing the step of determining the delay time by generating calibration signals for the data response and for the data strobe response signal and supplying the calibration signals to the test signal inputs for the data response and the data strobe response signal.

6. The method according to claim 5, wherein the calibration signals are generated as identical clock signals.

7. The method according to claim 4, which comprises:
   providing the test receiver with test signal inputs for receiving the data response and the data strobe response signal; and
   performing the step of determining the delay time by applying externally generated calibration signals to the test signal inputs.

8. The method according to claim 3, which comprises:
   providing the test receiver with test signal inputs for receiving the data response and the data strobe response signal; and
   performing the step of determining the delay time by generating calibration signals for the data response and for the data strobe response signal and supplying the calibration signals to the test signal inputs for the data response and the data strobe response signal.

9. The method according to claim 3, which comprises:
   providing the test receiver with test signal inputs for receiving the data response and the data strobe response signal; and
   performing the step of determining the delay time by applying externally generated calibration signals to the test signal inputs.

10. The method according to claim 9, wherein the calibration signals are generated as identical clock signals.

11. The method according to claim 10, wherein the calibration signals are each generated as a symmetrical clock signal having a frequency that agrees with a frequency of the data response and of the data strobe response signal.

12. The method according to claim 1, which comprises generating the data response as a data response signal group including individual signals having a common desired time relationship with the data strobe response signal generated in the memory module.

13. The method according to claim 1, which comprises:
    in the test receiver, determining and setting a delay time in accordance with desired values of a time relationship between the data response read from the memory module and the data strobe response signal;
    in the test receiver, generating the strobe signal delayed by the delay time from the data strobe response signal as received by the test receiver;
    providing the test receiver with a programmable delay device and programming the delay time into the programmable delay device;
    storing the delay time as a test comparison value; and using the test comparison value to test an actual time relationship between the data response and the data strobe response signal.

14. In combination with a memory module that generates a data strobe response signal and a data response while undergoing a test, a test receiver for reading and checking a time position of the data response read out from the memory module, the test receiver comprising:
    a test signal input for receiving the data response from the memory module;
    at least one latch circuit for storing the data response received from the memory module, said latch circuit having a set input and being connected to said test signal input; and
    a delay device having a programmable delay time and a set input;
    said delay device having a programmable delay time and receiving the data strobe response signal from the memory module and operating, in a test cycle, to delay the data strobe response signal by the delay time to obtain a delayed strobe signal;
    said delay device supplying the delayed strobe signal to said set input of said latch circuit such that the data response is strobed and stored in said latch circuit.

15. The test receiver according to claim 14, which comprises:
    a comparator for determining a result indicating whether a successful latching has occurred;
    a further test signal input for receiving the data strobe response signal from the memory module, the further test signal input and the test signal input together defining test signal inputs; and
    a calibration device for, in a calibration cycle, calibrating the delayed strobe signal with respect to the data response from the memory module;

during the calibration cycle, said test signal inputs receiving a clock signal and said calibration device using the clock signal to generate a value for calibrating the delay time of said delay device;

during the calibration cycle, said calibration device generating a calibration signal;

said latch circuit being connected to said comparator, said latch circuit and said comparator receiving the calibration signal.

16. The test receiver according to claim 15, wherein said calibration device includes:

an input serving as a programming input of said delay device;

a linear counter connected to said programming input of said delay device, said linear counter for stepwise changing the delay time of said delay device in the calibration cycle, said linear counter having a counting cycle with a plurality of counting positions;

a register unit that is controlled by the counting cycle of said linear counter, said register unit, during the calibration cycle, stepwise registering the result determined by said comparator over the plurality of the counter positions of said linear counter; and an evaluation device for evaluating the result that is registered by said register unit with regard to an optimum delay time for said delay device and for setting said counter to appropriately program the delay time in said delay device for a subsequent test cycle.

17. The combination according to claim 14, wherein:

the data response generated by the memory module is defined by a data response signal group having a plurality of data response signals; and said at least one latch circuit includes a plurality of latch circuits;

said plurality of said latch circuits corresponds in number to the plurality of the data response signals from the response signal group.

18. The test receiver according to claim 14, wherein said at least one latch circuit includes two latch circuits, one of the latch circuits for storing a rising edge of the data response and another of the latch circuits for storing a falling edge of the data response.

19. The combination according to claim 14, wherein:

the test receiver is constructed in a semiconductor circuit which is separate from conventional test equipment; and the test receiver is located in an immediate vicinity of the memory module to be tested.

20. The combination according to claim 14, wherein the memory module is a DRAM memory operated in a double data rate mode.

* * * * *